United States Patent [19]

Delaporte et al.

[11] Patent Number: 4,578,695

[45] Date of Patent: Mar. 25, 1986

[54] MONOLITHIC AUTOBIASED RESISTOR STRUCTURE AND APPLICATION THEREOF TO INTERFACE CIRCUITS

[75] Inventors: Francois-Xavier Delaporte, Cagnes; Gerard M. Lebesnerais, Perthes; Jean-Pierre Pantani, Nice, all of France

[73] Assignee: International Business Machines Corporation, Armonk, N.Y.

[21] Appl. No.: 554,025

[22] Filed: Nov. 21, 1983

[30] Foreign Application Priority Data

Nov. 26, 1982 [EP] European Pat. Off. ........ 82430037.0

[51] Int. Cl.⁴ .................... H01L 27/04; H02H 9/04; H03K 3/01; H03K 5/153
[52] U.S. Cl. .................................... 357/48; 357/51; 307/296 A; 307/296 R; 307/351; 361/91
[58] Field of Search .............. 363/62; 357/48, 51, 357/49, 48, 51; 307/303, 296 A, 296 R, 351; 361/91

[56] References Cited

U.S. PATENT DOCUMENTS

| | | | |
|---|---|---|---|
| 3,871,007 | 3/1975 | Wakamiya et al. | 357/49 |
| 3,894,893 | 7/1975 | Kabaya et al. | 357/48 |
| 3,940,785 | 2/1976 | Genesi | 357/51 |
| 3,990,092 | 11/1976 | Yoshimura | 357/51 |
| 4,024,417 | 5/1977 | Heuber et al. | 357/48 |
| 4,164,668 | 8/1979 | Delaporte et al. | 307/303 |
| 4,181,878 | 1/1980 | Murari et al. | 323/94 R |
| 4,340,922 | 7/1982 | Delaporte et al. | 361/91 |
| 4,454,647 | 6/1984 | Joy et al. | 357/49 |
| 4,466,011 | 8/1984 | Van Zanten | 357/48 |

FOREIGN PATENT DOCUMENTS

| | | | |
|---|---|---|---|
| 65453 | 5/1980 | Japan | 357/51 |
| 153529 | 10/1980 | Japan | 357/51 |

OTHER PUBLICATIONS

IBM Tech. Disclosure Bulletin, "DC Bias for EPI Pocket Pulse Appli.", vol. 13, No. 6, Nov. 1970, p. 1645.
Motorola Series in Solid-State Electronics, "Integrated Circuits, Design Principles and Fabrication", The Engineering Staff, Motorola, Inc., McGraw Hill, 1965, pp. 255-264.
IBM Technical Disclosure Bulletin, vol. 14: No. 11, Apr. 1972, "Low-Capacitance Diffused Resistor", Calhoun and Kaufman, p. 3339.

Primary Examiner—Martin H. Edlow
Assistant Examiner—E. Fallick
Attorney, Agent, or Firm—Wesley DeBruin; Mitchell S. Bigel

[57] ABSTRACT

A monolithically integrated resistive attenuator is autobiased from an input bipolar signal the amplitude of which is higher than the integrated circuit voltage supplies. The resistive attenuator is arranged in a first pocket formed in an epitaxial layer, and is connected between the input bipolar signal and ground. An intermediate tap produces an output signal. A diode and capacitor are formed in a second pocket. The diode is connected between the input bipolar signals and the epitaxial layer while the capacitor is connected between the epitaxial layer and the isolation walls thereof. The positive half-periods of the input bipolar signal charges the capacitor, which in turn biases the epitaxial layers. The attenuator, therefore, can be monolithically integrated into a silicon chip and remain isolated for all values of the input bipolar signal. The output signal produced by the attenuator is less than the integrated circuit voltage supplies so that the circuits driven by the output signal can be integrated without difficulties.

4 Claims, 3 Drawing Figures

MONOLITHIC AUTOBIASED RESISTOR STRUCTURE AND APPLICATION THEREOF TO INTERFACE CIRCUITS

BACKGROUND OF THE INVENTION

1. Technical Field

This invention relates to resistors which are monolithically integrated into a semiconductor substrate, and more particularly to an autobiased resistor, the input characteristics of which are independent of the voltage supplies of said substrate. It also relates to the use of such resistors in computer/peripheral equipment interfacing circuits.

2. Background Art

In the present state of the electronics art, there are many network configurations, wherein a computer, communications controller or other data processing unit is connected to up to several hundred peripheral units such as terminals, modems or printers. In such a network configuration, the interface circuit features must remain constant regardless of the number of peripheral units which are operating. Starting or stopping any peripheral unit must also not adversely affect operation of the other units. Moreover, the interface circuit must be capable of handling signal levels which are produced by different peripheral units manufactured by various manufacturers. Additional interface circuit operating parameters are determined from international standards (e.g., EIA RS-232-C) which define data exchange protocols, and set forth a set of hardware and software requirements.

Unfortunately, the data transmission field international standard EIA RS-232-C includes a number of requirements which make monolithic implementation of interface circuits difficult. For example, a particularly troublesome requirement is that the remote signals $V_{in}$ at the input of interface circuit receiver can vary from ±15 volts. However, the TTL logic circuits currently being used for interface circuits typically employ power supplies of +8.5 V and −8.5 V. Other logic circuit families may employ even lower power supply voltages. The requirement that the interface input circuitry accept input signals having higher values than the circuit supply voltage precludes monolithic integration of the interface circuits, as described below.

In planar monolithic integrated circuits, it is well-known that the maximum variations in the input and output signals must remain within values produced by the power supply circuits. Such a limitation arises from the fact that the devices (e.g., transistors, diodes or resistors) on the integrated circuit chip are isolated from one another by means of reverse biased PN junctions.

Thus, for example, an integrated circuit resistor is typically obtained by laying out a P-type diffused region, or body, in an N-type epitaxial layer. Clearly, in order for the PN junction thus formed to remain reverse biased, the potential in the epitaxial layer must be higher than any of the potentials existing along the resistor body, regardless of the signals applied to the resistor. Since a fixed voltage produced by the power supply circuits is typically applied to the epitaxial layer, all the signals at the resistor terminals must be of a lower voltage than the power supply voltage. This is clearly not possible under EIA RS-232C as described above, wherein a circuit having a power supply of ±8.5 V or less must accept input signals of up to ±15 V. Under such conditions, the PN junction isolation diode becomes forward biased and the resistor is no longer isolated so that the circuit will not function. Accordingly, such a requirement precludes monolithic fabrication of input resistors on the same substrate as the interface circuits.

A first solution to the problem of the supply voltages being lower than the input signal voltage is to provide an additional high voltage power supply circuit for the epitaxial layer isolation function. Such a solution is not desirable because of its high cost. An alternative solution is to employ discrete resistors for the interface circuit input resistors. Such a solution is costly, cumbersome and inherently less reliable than an all-monolithic approach.

DISCLOSURE OF THE INVENTION

It is therefore a primary object of this invention to provide a monolithically integrated interface circuit, the input characteristics of which are independent of the presence or absence of the voltage supplies.

It is another object of this invention to provide a monolithic integrated interface circuit which can receive input voltages higher in absolute value that the integrated circuit voltage supplies.

It is yet another object of this invention to provide an autobiased resistor structure for use in a monolithic integrated interface circuit.

These and other objects are attained by providing a monolithically integrated resistive attenuator which steps down the input signal $V_{in}$ to a voltage $V_{out}$ which is lower than the integrated circuit voltage supply. The rest of the receiver, which is driven by signal $V_{out}$, can easily be made in monolithic form.

Means are provided for autobiasing the resistive attenuator from the input signal itself, so that the resistive attenuator may be monolithically fabricated along with the rest of the receiver, in a manner which maintains resistor isolation. More particularly, the attenuator resistor, alone, is laid out in an isolated pocket of the epitaxial layer. It receives input signal $V_{in}$ at one end, with the other end being at ground potential. An intermediate tap produces $V_{out}$, the output signal. In another isolated pocket, a diode is arranged between the terminal to which input voltage $V_{in}$ is applied, and the epitaxial layer and a capacitor is arranged between the epitaxial layer and ground. Thus, when input voltage $V_{in}$ is positive, the capacitor is charged and maintains the epitaxial layer at a potential in the vicinity of voltage $V_{in}$. The junction formed between the resistor body and the epitaxial layer is always biased to about 0 volt, thereby ensuring perfect isolation.

DETAILED DESCRIPTION OF THE INVENTION

In order to provide a monolithically integrated receiver satisfying EIA RS-232-C standards, this invention employs an interface circuit which includes a resistive attenuator formed of two resistors R1 and R2 of values chosen so that the output voltage are made lower than the voltage supplies. In the above-mentioned example, the voltage $V_{in}$ is equal to $\pm 15$ V and $V_{cc} = \pm 8.5$ V; when choosing R1=R2, the voltage at the attenuator output will, therefore, be $V_{out} = \pm 7.5$ V. Since the remaining receiver circuitry will be driven by such a voltage, the circuitry will be easily integrated.

It will be apparent to those having skill in the art that, with other standards, (e.g., EIA RS-232A-B where $V_{in} = \pm 25$ V) and/or with different voltage supplies Vcc, appropriate values for R1 and R2 will be chosen so that the output voltage of the resistive attenuator is lower than the voltage supplies.

It is also apparent that an interface circuit could be achieved with discrete resistors which, of course, do not raise isolation problems. However, discrete resistors would require a costly hybrid solution, i.e., thin film resistors associated with integrated chips, or would require resistors directly soldered to the modules containing the monolithically integrated receivers.

Figure 1:
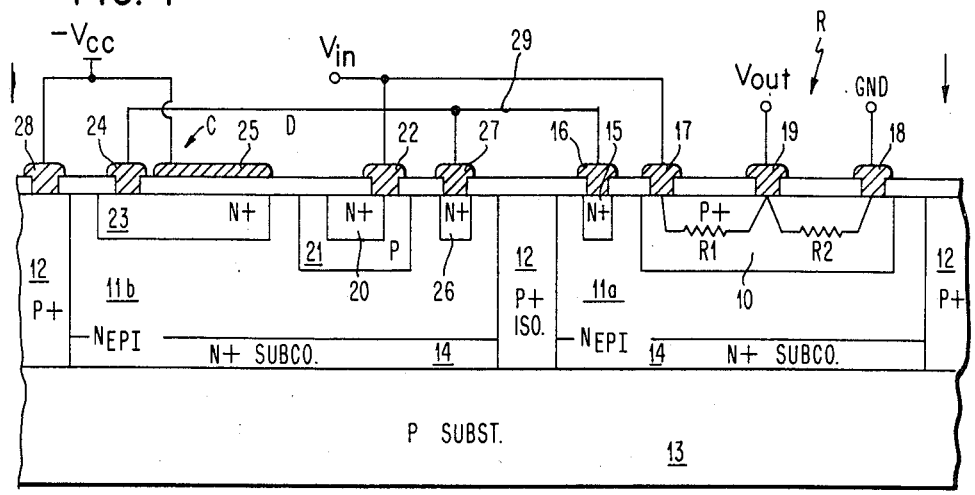
FIG. 1 is a cut away view of a monolithic resistor structure autobiased by a diode-capacitor structure according to the present invention.

Referring now to FIG. 1, there is shown a cut away view of resistor R conventionally integrated into a silicon semiconductor chip. The body of resistor 10 is obtained through the diffusion of a P type region simultaneous with the diffusion of the P base regions of the NPN transistors in the N type epitaxial layer 11. Resistor R is laid out in a bed 11a of the epitaxial pocket which is isolated in a conventional way by P+ isolation walls 12 which extend to the P silicon substrate 13. A subcollector region 14 can advantageously be formed at the bottom of the pocket. The resistor R structure is also comprised of an N+ region 15 which is simultaneously diffused with the emitter regions and which ensures good contact with the epitaxy. It is the contact of this region 15 which is normally connected to the most positive potential that exists on the chip, for backward bias of the epitaxy-substrate-isolation junction. Resistor R is formed of two resistors R1 and R2 of equal values. Input voltage $V_{in}$ is applied to terminal 17 of resistor R whereas ground potential GND is applied to the other terminal 18. A voltage $V_{out}$ having a value of $V_{in}/2$ is therefore obtained at terminal 19 which is arranged at the center of resistor R. Voltage $V_{out}$ is applied as an input voltage to a conventional receiver (not shown).

A complementary structure comprising a diode D and a capacitor C, formed in pocket 11b, is associated with resistor structure R. Diode D is achieved in a conventional way by the base-collector junction of an NPN transistor the emitter-base junction of which, formed between N+ region 20 and P region 21, is shorted by contact 22. Capacitor C illustrated here, is of the MOS type, an electrode thereof is formed of N+ region 23 and contact 24, thereof, the other electrode being formed of metal land 25.

The capacitor-diode structure also includes an N+ region 26 ensuring a good contact with the epitaxial layer 11 of this pocket. Region 26 is provided with contact 27. A contact 28 is obtained on one of the isolation walls 12 so as to apply the most negative potential that is available on the chip, namely potential $-V_{cc}$, to the substrate-isolation assembly. Such an assembly, brought to DC potential $-V_{cc}$, should be realized as being connected to AC ground in view of the decoupling capacitors in the supply circuits.

The resistor structure R is the basis of the above-mentioned interface circuit and, therefore, is formed of two resistors R1 and R2 of equal values, the purpose of which is to divide voltages $V_{in}$, into two. For implementation of this invention, it is mandatory that each resistor R is laid out in an isolated pocket, even when the chip is comprised of a plurality of interface circuits and corresponding receivers. As shown in FIG. 1, voltage $V_{in}$ is also applied to the anode of diode D. The cathode of such a diode is, in fact, comprised of the N type epitaxial layer 11, and, therefore, is in series with that of the electrode of capacitor C comprised of N+ region 23.

Region 23, region 26 and region 15 are interconnected by line 29, the electrical potential of which is the potential of the epitaxial layer. It should be observed that these regions are not connected to an off-chip potential; the epitaxy, therefore, is left "floating". This floating epitaxial region is contrary to prior art structures where all the epitaxial pockets are brought to a fixed potential (generally the potential of a voltage supply) which is the most positive potential that exists on the chip. The other electrode of capacitor C i.e., the metal land 25, is connected to the substrate-isolation assembly, i.e., to the AC ground potential.

Figure 2:
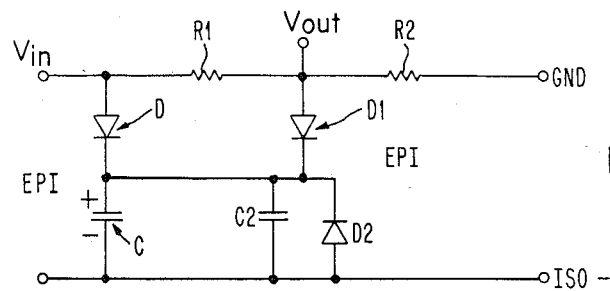
FIG. 2 is an equivalent electrical schematic diagram of the structure shown in FIG. 1.

Operation of the invention will be better understood with reference to FIG. 2 which illustrates the electrical schematic diagram equivalent to the structure of FIG. 1. The same elements have the same reference numerals. There have been added only diode D1 which stands for the diode assembly formed between the resistor body 10 and the epitaxial layer 11, diode D2 which stands for the diode assembly of the junction formed between the epitaxial layer 11 and the substrate-isolation assembly, and, finally, capacitor C2 which stands for the capacitor assembly of this junction.

Assume that, at time t0, all the regions are at potential 0V, except, of course, for the substrate-isolation assembly which is at potential $-8.5$ V. When $V_{in}$ is brought to a positive voltage $+15$ V, diode D is forward biased between the applied $+15$ V and $-8.5$ V, and a current will develop to charge the capacitor C to a potential substantially equal to $+15$ V. The value of such a current is determined essentially by the resistance of the diode (small) and the capacitance which the circuit manufacturer can adjust at will, more particularly, according to the sizes he gives to the electrodes 23 and 25 of capacitor C. It is advisable to choose a value for C which is relatively small so that the biased circuit of diode D and capacitor C appears, from the outside, as a high impedance circuit, but which is relatively high so as to maintain the charge during the negative alternations of the signal.

When capacitor C is charged with a $+15$ V potential, it will positively bias the different portions of the epitaxial layer which are isolated in different pockets. More particularly, the pocket containing resistor R is positively biased because of the interconnection 29 which connects region 23 to region 15. The junction formed between the resistor body 10 and the epitaxial layer 11 is substantially biased to a zero voltage, and said body can be considered isolated.

Such a condition will last as long as $V_{in}$ is maintained at $+15$ V. When $V_{in}$ is brought to $-15$ V, diode D as well as diode D1 are backward biased because of the charge of capacitor C. This capacitor C will maintain a potential approaching $+15$ V as long as the leakage currents do not discharge it. The leakage currents come mainly from the parasitic resistance which is at terminals of diode D2 which, however, is considerable (e.g., 1000 MΩ). It has been observed that for signals $V_{in}$ that have their polarities changed very slowly, the potential of the epitaxy follows approximately $V_{in}$, maintaining a zero bias, (therefore, zero current) at the resistor-/epitaxial layer junction terminals.

Finally, it should be noted that, when at t0, $V_{in}$ is brought to −15 V, the above description does not apply, but the assembly, however, works correctly. Indeed, diode D2 is current conducting between −8.5 V and −15 V, through a parasitic resistor parallel-mounted to D1. The potential of the epitaxial layer therefore stabilizes at the potential of the isolation-substrate assembly (disregarding diode D2) to about −8.5+(−0.5) or −9 V. Isolation is ensured since the junction between the resistor body (brought to $V_{in}$=−9 V) and the epitaxial layer (brought to −9 V) is biased into the non-conducting state. It can also be verified that, even if Vcc falls to zero volts with respect to ground, such an isolation would still be ensured.

As soon as $V_{in}$ is brought back to +15 V, capacitor C is charged more or less quickly according to the time during which $V_{in}$ is maintained to such a level. The epitaxial layer is very rapidly biased to +15 V.

It will be noted that the monolithic integrated resistor autobiasing principle has been applied above to a dividing bridge, i.e., to a resistor provided with an intermediate point. Applications, however, can be found (adaption, line end resistors, etc.) wherein the mid point is not necessary.

The interface circuit, comprised of the resistive attenuator formed of resistor R with a mid point (where the output voltage $V_{out}$ is available) and its autobiasing structure composed of elements D and C, can be easily integrated into the same chip as the receiver, by means of any conventional bipolar process.

Resistor R, therefore, has a pocket autobias which is ensured by input signals $V_{in}$ and not by an off-chip supply. It is easy to understand that, when this off-chip supply disappears (e.g., a machine out order), the interface circuit keeps the same input characteristics as if the machine were still operating. Roughly, it can be considered that the resistor R is autobiased by the half-period rectification of the input bipolar voltage $V_{in}$ by virtue of a very small charge constant (resistance of diode D×capacitance C) and a very high discharge constant (leakage resistance of diode D2×capacitance C).

In a conventional bipolar process for conventional analog applications involving the above-mentioned example, the following typical values may be employed: The layer resistance of the diffused P-type region 10 is about 100–150 Ω/□. Epitaxial layer 11 is about 10 μm thick and its resistivity is 1 Ωcm. The oxide layer above region 23 is about 250–300 μm thick, which makes it possible to have capacitance of 10 pF on a surface which is about 0.10 mm². Resistor R is of a value generally comprised within 3–5 kΩ. It is, for instance, comprised of two 2.1 kΩ elements. The above-mentioned value C=10 pF can be chosen for this structure.

Referring again to FIG. 2, it will be observed that diode D is parallel-mounted with diode D1 and, likewise, capacitor C is parallel-mounted with capacitor C2. Moreover, capacitor C2 and diode D1 have substantially the same features as capacitor C and diode D, respectively. Thus, in conformity with the applications (amplitude of signal $V_{in}$) and with the nature of the utilized bipolar process, it can be said that the epitaxial bed of resistor R is capable of being biased by itself.

Accordingly, the interface circuit of this invention can be limited to a single integrated resistor structure arranged in an isolation pocket and comprised of a body 10 with a contact 19 in the midpoint thereof, having in addition two end contacts (17, 18). The resistor appears to be floating, but actually is not; it is autobiased by the combined action of the high amplitude signal $V_{in}$ with its parasitic elements D1, C2 which operate the same way as the above-mentioned elements D, C.

It is well known in the art how to use floating resistors in applications having low amplitude signals (amplitudes lower than 100 mV) and high frequencies (MHz) which, therefore, are quite different from this application; the latter, indeed, is characterized by the use of high amplitude signals (amplitudes in the order of several volts) and low frequencies (lower than 20 KHz). In the prior art applications, the purpose has been to reduce at most the capacitance, whereas in this application, such a capacitance must be maintained to a sufficient value so that, when combined with signal $V_{in}$, the autobias is effective.

Figure 3:
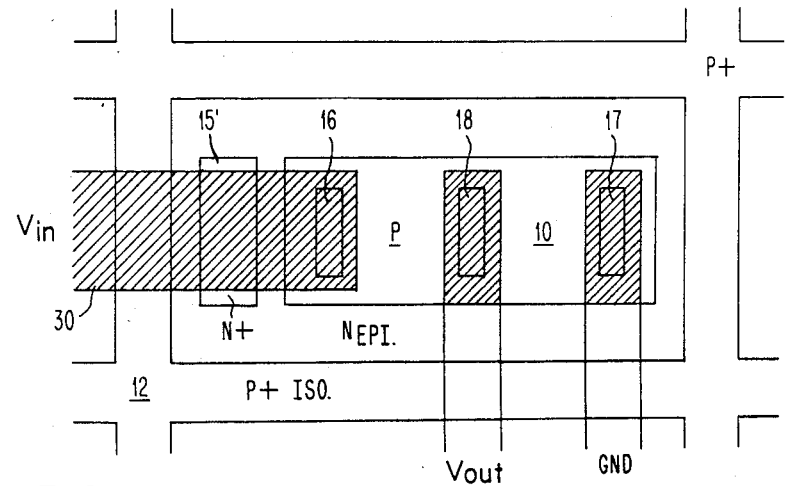
FIG. 3 is a planar view of an autobiased resistor structure according to another embodiment of the invention.

Region 15, therefore, is no more necessary as a contact region; however, it may be advantageous, and even sometimes mandatory, to preserve it in some applications. Referring to FIGS. 1 and 3, when the potential of the substrate-isolation assembly is −Vcc=−8.5 V and when the input voltage $V_{in}$ applied to the interface circuit is $V_{in}$=−15 V, there is a parasitic FET transistor, i.e., a conduction channel occurs between the P type resistor body 10 and the P+ isolation wall 12, at land 30 of the metallization. The N+ region which could be placed anywhere in the pocket of resistor R, and which is rendered superfluous by resistor R autobias, can be maintained and placed between the resistor body and the isolation wall. Region 15, in FIG. 3, illustrates such a solution and as it is N+ doped, it prevents said conduction channel, from occurring.

While the invention has been particularly shown and described with reference to a preferred embodiment thereof, it will be understood by those skilled in the art that various changes in form and details may be made without departing form the spirit and scope of the invention.

We claim:

1. In an integrated circuit an autobiased resistor structure (FIG. 1) fabricated on a P type semiconductor substrate (13) comprising:

an N type epitaxial layer (11a, 11b) on said substrate;

a P type isolation wall (12) extending through said epitaxial layer to said substrate, said isolation wall forming first and second isolated N type epitaxial pockets (11a, 11b) on said substrate;

first and second spaced apart N+ type regions (23, 26) contained in said first N type epitaxial pocket;

a first P type region (21) contained in said first N type epitaxial pocket, said first P type region positioned between and spaced from said first and second N+ type regions contained in said first N type epitaxial pocket;

a N+ type pocket (20) contained in said first P type region contained in said first N type epitaxial pocket;

a third N+ type region (15) contained in said second N type epitaxial pocket;

a first P+ type region (10) contained in second N type epitaxial pocket;

an electrode (25), said electrode spaced from and coextensive with at least a portion of said first N+ type region contained in said first N type epitaxial pocket;

a first connection means (28) electrically connecting said P+ type isolation wall (12), said P substrate (13) and said electrode (25) to a source of potential $V_{CC}$;

second connection means (29) electrically connecting in common said first and second spaced apart N+ type regions (23, 26) contained in said first N type epitaxial pocket and said third N+ type region (15) in said second N type epitaxial pocket;

first, second and third spaced apart contacts (17, 18, 19), said first, second and third spaced apart contacts, in the order recited, electrically contacting said first P+ region (10) contained in said N type epitaxial pocket;

third connection means electrically connecting in common said N+ type pocket (20) contained in said first P type region (21), said first P type region (21) contained in said first N type epitaxial pocket, said first contact (17) and a source of potential $V_{in}$;

fourth connection means connecting said third contact (18) to a source of potential $V_{GND}$;

fifth connection means connecting said second contact (19) to an output terminal $V_{out}$ for providing an output voltage $V_{out}$; and, said first P+ region is a voltage divider resistor (R1 + R2) having first, second and third taps provided by said first, second and third contacts (17, 18, 19), and said resistor is electrically isolated from said substrate by diode/capacitor circuit means.

2. In an integrated circuit an autobiased resistor structure fabricated on a P type semiconductor substrate comprising:

an N type epitaxial layer formed on said substrate;

a P type isolation wall extending through said epitaxial layer to said substrate, said isolation wall forming first and second isolated N type epitaxial pockets on said substrate;

first and second spaced apart N+ type regions contained in said first N type epitaxial pocket;

a first P type region contained in said first N type epitaxial pocket, said first P type region positioned between and spaced from said first and second N+ type regions contained in said first N type epitaxial pocket;

an N+ type pocket contained in said first P type region contained in said first N type epitaxial pocket;

a third N+ type region contained in said second N type epitaxial pocket;

a first P+ type region contained in said second N type epitaxial pocket;

an electrode, said electrode spaced from and coextensive with at least a portion of said first N+ type region contained in said first N type epitaxial pocket;

first connection means electrically connecting said P+ type isolation wall, said P substrate and said electrode to a source of potential $V_{cc}$;

second connection means electrically connecting in common said first and second spaced apart N+ type regions contained in said first N type epitaxial pocket and said third N+ type region contained in said second N type epitaxial pocket;

first, second and third spaced apart contacts, said first, second and third spaced apart contacts, in the order recited, electrically contacting said first P+ region contained in said second N type epitaxial pocket;

third connection means electrically connecting in common said N+ type pocket contained in said first P type region, said first P type region contained in said first N type epitaxial pocket, said first contact and a source of potential $V_{in}$;

fourth connection means connecting said third contact to a source of potential $V_{GND}$;

fifth connection means connecting said second contact to an output terminal $V_{out}$, for providing an output voltage $V_{out}$, where the magnitudes of $V_{in}$, $V_{out}$ and $V_{GND}$ bear the following relationship one to another $|V_{in}| > |V_{out}| > |V_{GND}|$; and, said first P+ region is a voltage divider resistor having first, second and third taps provided by said first, second and third contacts, and said resistor is electrically isolated from said substrate by diode/capacitor circuit means.

3. In an integrated circuit an autobiased resistor structure fabricated on a P type semiconductor substrate, as recited in claim 2, wherein the equivalent circuit (FIG. 2) of said autobiased resistor structure recited in claim 16 comprises:

a $V_{in}$ terminal connected to said source of potential $V_{in}$;

a $V_{out}$ terminal for providing said output potential $V_{out}$;

a $V_{GND}$ terminal connected to said source of potential $V_{GND}$;

a $V_{CC}$ terminal (ISO-SUBST.) connected to said source of potential $V_{CC}$;

a resistor R1 connected between said $V_{in}$ terminal and said $V_{out}$ terminal;

a resistor R2 connected between said $V_{out}$ terminal and said $V_{GND}$ terminal;

a first diode D having an anode and a cathode, said anode of said first diode connected to said $V_{in}$ terminal;

a second diode D1 having an anode and a cathode, said anode of said second diode connected to said $V_{out}$ terminal;

a third diode D2 having an anode and a cathode, said anode of said third diode connected to said $V_{CC}$ terminal;

a first capacitor C having a first terminal and a second terminal said first terminal connected to said $V_{CC}$ terminal;

a second capacitor C2 having a first terminal and second terminal, said first terminal connected to said $V_{CC}$ terminal; and common connection means, connecting in common said cathode of said first diode D, said cathode of said second diode D1, said anode of said third diode, said second terminal of said first capacitor and said second terminal of said second capacitor, whereby said potential of said epitaxial layer of said autobiased resistor structure floats and has a magnitude corresponding to the potential of said common connection means, and said P type isolation wall and said P type substrate are maintained at said potential $V_{CC}$.

4. In an integrated circuit an autobiased resistor structure fabricated on a P type substrate, as recited in claim 3, wherein said floating potential of said epitaxial layer of said autobiased resistor structure is close in magnitude to said input voltage $V_{in}$ impressed on terminal $V_{in}$ and said resistors R1 and R2 are electrically isolated from said P type wall and said P type substrate.

* * * * *